(12) United States Patent
Chang et al.

(10) Patent No.: US 6,737,737 B1
(45) Date of Patent: May 18, 2004

(54) SEMICONDUCTOR PACKAGE WITH CHIP SUPPORTING MEMBER

(75) Inventors: Chin-Huang Chang, Taichung (TW); Chin-Tien Chiu, Taichung (TW); Jung-Pin Huang, Taichung (TW)

(73) Assignee: Siliconware Precision Industries Co., Ltd. (TW)

( * ) Notice: Subject to any disclaimer, the term of this patent is extended or adjusted under 35 U.S.C. 154(b) by 0 days.

(21) Appl. No.: 10/355,610

(22) Filed: Jan. 31, 2003

(30) Foreign Application Priority Data

Nov. 27, 2002 (TW) ........................................ 91134412 A

(51) Int. Cl.$^7$ .......................................... H01L 23/495
(52) U.S. Cl. ........................................ 257/676; 257/666
(58) Field of Search .................................. 257/676, 666

(56) References Cited

U.S. PATENT DOCUMENTS

| 5,455,454 A | | 10/1995 | Oh et al. | 257/676 |
| 5,528,076 A | * | 6/1996 | Pavio | 257/666 |
| 6,441,400 B1 | * | 8/2002 | Miyaki et al. | 257/66 |
| 6,516,994 B2 | * | 2/2003 | Takahashi | 228/180.5 |
| 6,534,342 B2 | * | 3/2003 | Grigg et al. | 438/118 |
| 2001/0015481 A1 | * | 8/2001 | Miyaki et al. | 257/673 |

* cited by examiner

Primary Examiner—David Nelms
Assistant Examiner—Tu-Tu Ho
(74) Attorney, Agent, or Firm—Peter F. Corless; Steven M. Jensen; Edwards & Angell, LLP

(57) ABSTRACT

A semiconductor package with a chip supporting member is provided, including a lead frame having a die pad and a plurality of leads, and a chip supporting member mounted on a central portion of the die pad. The chip supporting member has a first surface and an opposing second surface attached to the die pad. At least a chip is mounted on the first surface of the chip supporting member to space the chip apart from the die pad via the chip supporting member, so as to prevent the chip from being damaged by thermal stress induced by CTE (coefficient of thermal expansion) mismatch between the chip and lead frame, thereby eliminating delamination, warpage and chip cracks. Moreover, the chip supporting member interposed between the chip and die pad provides greater flexibility for mounting variously sized or shaped chips on the die pad without having to use chips corresponding to profile of the die pad.

20 Claims, 4 Drawing Sheets ized or shaped chips to be accommodated by a single type of lead frame without having to fabricate a die pad in compliance with profile of the chips, so as to simplify fabrication processes for the lead frame and thereby reduce fabrication costs of the semiconductor package.

SEMICONDUCTOR PACKAGE WITH CHIP SUPPORTING MEMBER

FIELD OF THE INVENTION

The present invention relates to semiconductor packages, and more particularly, to a semiconductor package using a lead frame as a chip carrier, which can reduce or minimize contact area between a chip and a die pad of the lead frame.

BACKGROUND OF THE INVENTION

A lead-frame-based semiconductor package using a lead frame as a chip carrier usually renders a reliability issue in terms of thermal stresses being generated due to mismatch in CTE (coefficient of thermal expansion) between a chip and a silver paste for attaching the chip to the lead frame and between the silver paste and the lead frame. In particular, the chip is mounted on a die pad of the lead frame via the silver paste and encapsulated by an encapsulant; due to different CTEs (chip: about 4 ppm, silver paste: about 40 ppm, die pad: about 16 ppm), significant thermal stresses would be induced at interfaces between the chip and silver paste and between the silver paste and die pad, such that under temperature variation in a reliability test or practical operating environment, the semiconductor package may be subject to delamination and chip cracks by effect of thermal stresses, making quality of the semiconductor package undesirably degraded. This situation is more severe in the use of a larger die pad or chip in which contact area between the die pad and chip is increased and the die pad would suffer greater thermal stresses during a temperature cycle, thereby resulting in warpage and poor planarity of the die pad and further causing delamination between the chip and die pad.

In response to the above problems, a solution is to use a lead frame having a die pad being formed with an opening. As shown in FIG. 7, this lead frame 40 is composed of a die pad 400 and a plurality of leads 401, and the die pad 400 is formed with at least an opening 402 by which a chip 42 is mounted on the die pad 400 via an adhesive (not shown) and contact area between the chip 42 and die pad 400 can be reduced. However, although the chip 42 would be subject to less thermal stresses due to reduction in contact area between the chip 42 and die pad 400, this structure can only be applicable in the case of the chip 42 being larger in surface area than the opening 402 of the die pad 400, thereby setting a limitation to sizes and types of chips suitably used in the above structure. Moreover, fabrication of a die pad 400 in compliance with profile of the chip 42 increases process complexity and costs of the lead frame 40.

Accordingly, U.S. Pat. No. 5,455,454 discloses provision of a tape between a chip and a die pad of a lead frame. As shown in FIGS. 8A and 8B, this lead frame 50 is composed of a chip supporting structure including a plurality of supporting bars 502 and tie bars 503 that are integrally formed with the supporting bars 502 and connected to a frame (not shown) of the lead frame 50, and a plurality of leads 501 surrounding the chip supporting structure and connected to the frame. A tape 55 is attached to the chip supporting structure and has one surface thereof covering the supporting bars 502, part of the tie bars 503 and part of the leads 501, allowing a chip 52 to be mounted to an opposing surface of the tape 55.

Provision of the tape attached to the chip supporting structure for accommodating the chip can solve the problem of limitation in chip sizes, making the die pad not necessarily formed corresponding to profile of the chip. However, the use of the tape increases fabrication costs and difficulty in performing a die-bonding process for mounting the chip on the tape. Moreover, as the chip and tape are made of different materials, it may easily causes delamination at an interface between the chip and tape, and thus still fails to solve the problem of delamination between the chip and die pad.

SUMMARY OF THE INVENTION

A primary objective of the present invention is to provide a semiconductor package with a chip supporting member, which can prevent direct contact between a chip and a die pad to thereby eliminate chip cracks, delamination between the chip and die pad, and warpage of the die pad in response to thermal stresses, so as to assure reliability of the semiconductor package.

Another objective of the invention is to provide a semiconductor package with a chip supporting member, which allows variously sized or shaped chips to be accommodated by a single type of lead frame without having to fabricate a die pad in compliance with profile of the chips, so as to simplify fabrication processes for the lead frame and thereby reduce fabrication costs of the semiconductor package.

A further objective of the invention is to provide a semiconductor package with a chip supporting member for minimizing contact area between a chip and a die pad, so as to reduce undesirably effect from thermal stresses induced by CTE (coefficient of thermal expansion) mismatch between the chip and die pad on the semiconductor package.

In accordance of the foregoing and other objectives, the present invention proposes a semiconductor package with a chip supporting member, comprising: a lead frame having at least a die pad and a plurality of leads; a chip supporting member having a first surface and a second surface opposed to the first surface, wherein the second surface of the chip supporting member is attached to a central portion of the die pad, and positions on the first surface of the chip supporting member are spaced apart from corresponding positions on the second surface of the chip supporting member by an identical vertical distance; a chip mounted on the first surface of the chip supporting member, allowing the chip supporting member to be interposed between the chip and die pad; a plurality of bonding wires (such as gold wires) for electrically connecting the chip to the leads; and an encapsulant formed on the lead frame for encapsulating the chip supporting member, chip and bonding wires.

The chip supporting member can be made of a dummy die (i.e. functionless chip), a metal plate (such as copper, aluminum, etc.), or a polymer material having a CTE similar to that of the chip. Moreover, without affecting attachment between the chip and die pad, the chip supporting member can be flexibly shaped and sized. In order to prevent formation of voids during fabrication of the encapsulant, the chip support member has a height larger than a minimum distance capable of being penetrated by fillers of a resin used for forming the encapsulant. By disposing the chip supporting member between the chip and die pad, effect of thermal stresses induced by CTE mismatch on the chip and die pad can be reduced, thereby preventing delamination at e.g. corner portions thereof normally subjecting to relatively stronger thermal stresses so as to improve quality and reliability of the semiconductor package.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

Preferred embodiments of a semiconductor package with a chip supporting member proposed in the present invention are described in detail with reference to FIGS. 1 to 6.

First Preferred Embodiment

Figure 1:
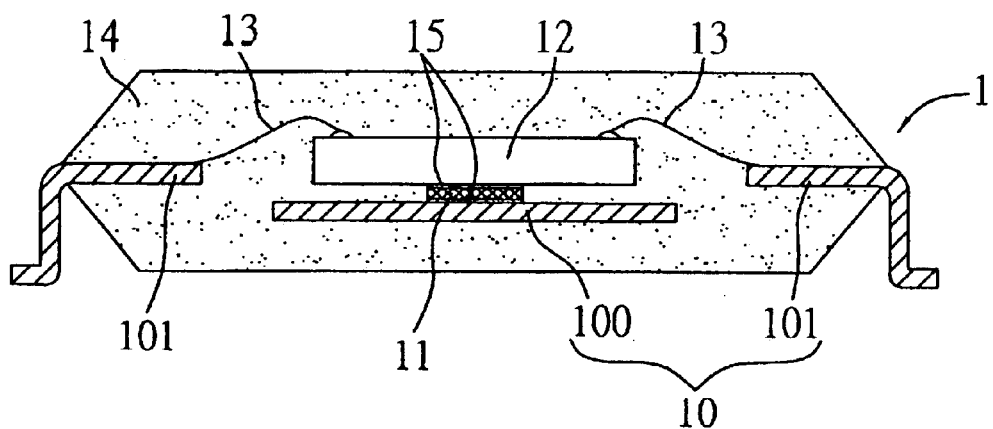
FIG. 1 is a cross-sectional view of a semiconductor package according to a first preferred embodiment of the invention.

As shown in FIG. 1, the semiconductor package 1 with a chip supporting member according to a first preferred embodiment of the invention includes a lead frame 10 having at least a die pad 100 and a plurality of leads 101; a chip supporting member 11 attached to a central portion of the die pad 100; a chip 12 mounted on the chip supporting member 11; a plurality of bonding wires 13 (such as gold wires) for electrically connecting the chip 12 to the leads 101; and an encapsulant 14 for encapsulating the chip supporting member 11, chip 12, bonding wires 13 and part of the lead frame 10.

Figure 2:
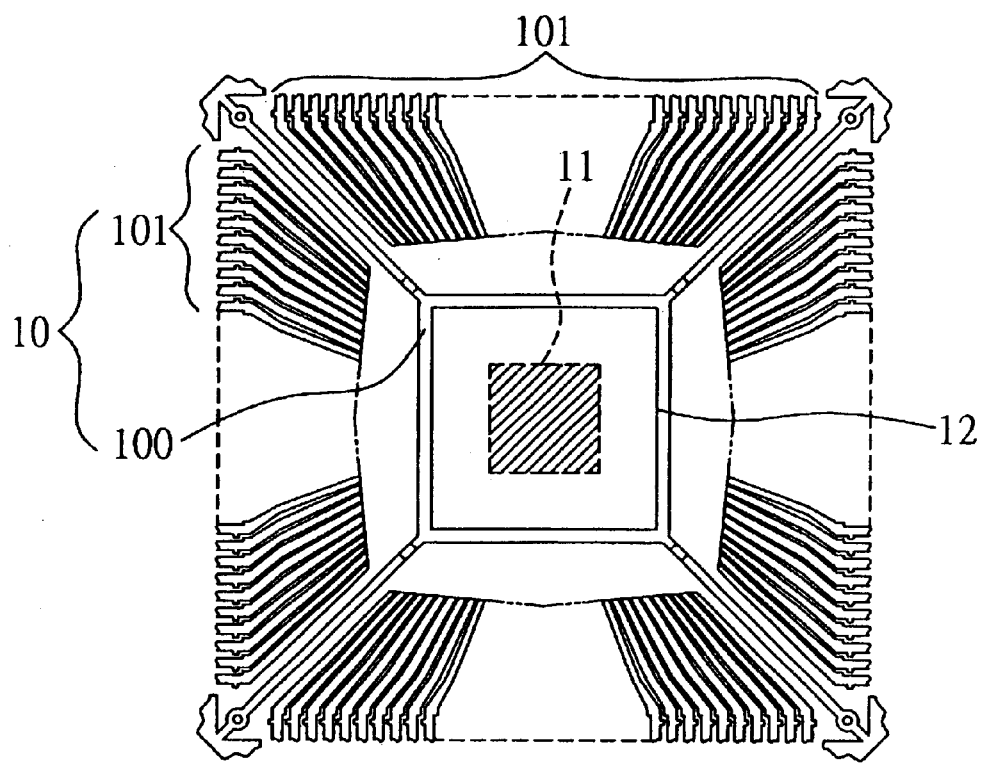
FIG. 2 is a top view of the semiconductor package after completing a die-bonding process according to the invention.

As shown in FIGS. 1 and 2, the lead frame 10 is made of a metal material such as copper or copper alloy, and is composed of a die pad 100 and a plurality of leads 101 around the die pad 100. The die pad 100 can be a full pad, a window pad formed with openings of a flexible shape and number, or a small size die pad having a size smaller than a chip. Moreover, other chip supporting structures such as supporting bars and tie bars may be integrally formed with the lead frame 10 and facilitate accommodation of the chip supporting member 11, also suitably applicable in this invention.

Figure 3:
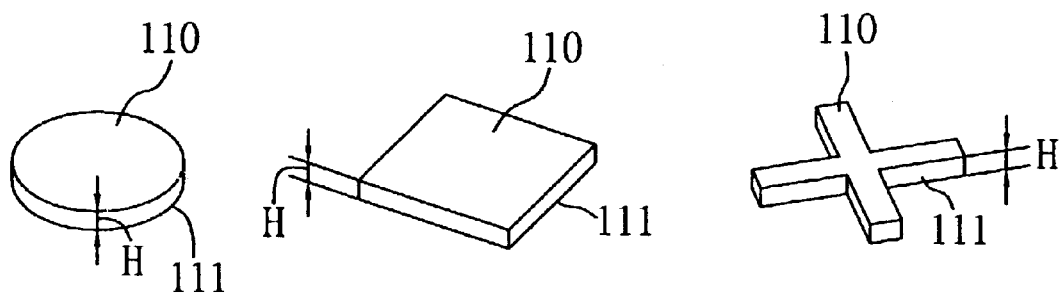
FIG. 3 is a perspective view showing various structures of a chip supporting member in the semiconductor package according to the invention.

The chip supporting member 11 can be made of a dummy die (i.e. functionless chip), a metal plate (such as copper, aluminum, etc.), or a polymer material having a coefficient of thermal expansion (CTE) similar to that of the chip 12. As shown in FIG. 3, the chip supporting member 11 can be a cylindrical or square column processed by cutting and grinding, and has a first surface 110 and a second surface 111 opposed to the first surface 110, wherein positions on the first surface 110 of the chip supporting member II are spaced apart from corresponding positions on the second surface 111 of the chip supporting member 11 by an identical vertical distance, so as to maintain good planarity for the chip 12 mounted on the chip supporting. member 11. A silver paste 15 is applied over the first and second surfaces 110, 111 of the chip supporting member 11, for attaching the second surface 111 to the die pad 100 and mounting the chip 12 on the first surface 110 of the chip supporting member 11 in a manner that the chip supporting member 11 is interposed between the chip 12 and die pad 100. The chip supporting member 11 has a height H at least larger than a minimum distance capable of being penetrated by fillers of a resin used for forming the encapsulant 14, generally at least greater than 3 mils.

Moreover, the chip supporting member II can be flexibly shaped without particular limitation, such as a cylindrical column, square column, trapezoid column, X-shaped column, etc. Furthermore, besides the central portion of the die pad 100, the chip supporting member 11 can also be mounted at any other suitable positions on the die pad 100. As the chip 12 is elevated above the die pad 100 by a height difference H between the chip 12 and die pad 100 equal to the height H of the chip supporting member 11, contact area between the chip 12 and die pad 100 via the silver paste 15 is minimized, and effect of thermal stresses on the chip 12 and die pad 100 can be significantly reduced during a temperature cycle in subsequent fabrication processes to thereby eliminate chip cracks and delamination between the chip 12 and die pad 100. With the chip 12 being spaced apart from the die pad 100 by the chip supporting member 11, it is not necessary to comply the size the chip 12 with surface area of the die pad 100, making variously sized and shaped chips suitably applied to a single type of die pad and thereby effectively reducing fabrication costs of the lead frame.

Second Preferred Embodiment

Figure 4:
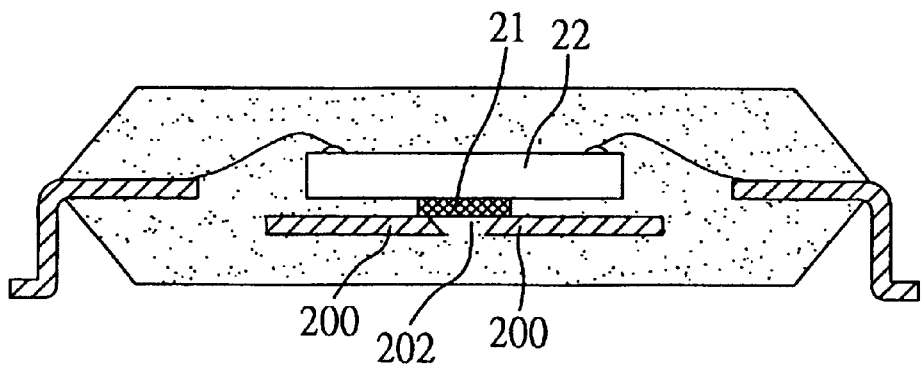
FIG. 4 is a cross-sectional view of a semiconductor package according to a second preferred embodiment of the invention.

FIG. 4 illustrates a semiconductor package according to a second preferred embodiment of the invention. As shown in the drawing, this semiconductor package is similar in structure to that of the first preferred embodiment, with the difference in that the die pad 200 is formed with at least an opening 202, and a periphery of the opening 202 can be shaped as stairs or gradients without particular limitation; this is to help anchor a silver paste (not shown) and prevent the silver paste from contaminating unintended area such as a bottom surface of the die pad 200 and leading to delamination. It should be understood that, besides formation of the opening 202, other structural designs or arrangements of the die pad 200 without affecting incorporation of the chip supporting member 21 on the die pad 200 are also included within the scope embraced by this invention.

Third Preferred Embodiment

Figure 5:
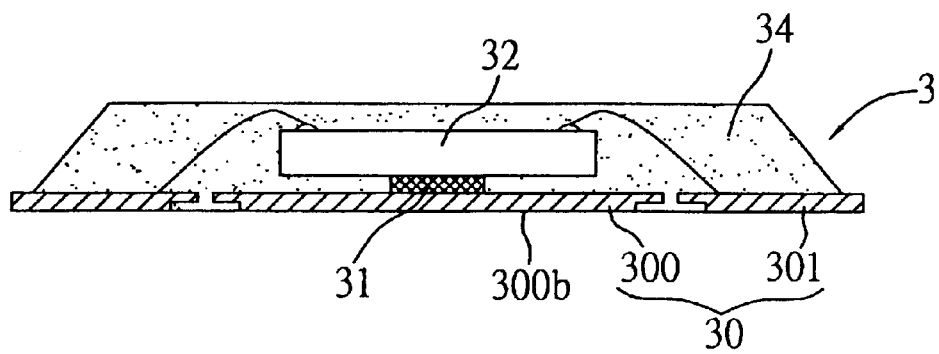
FIG. 5 is a cross-sectional view of a semiconductor package according to a third preferred embodiment of the invention.
Figure 6:
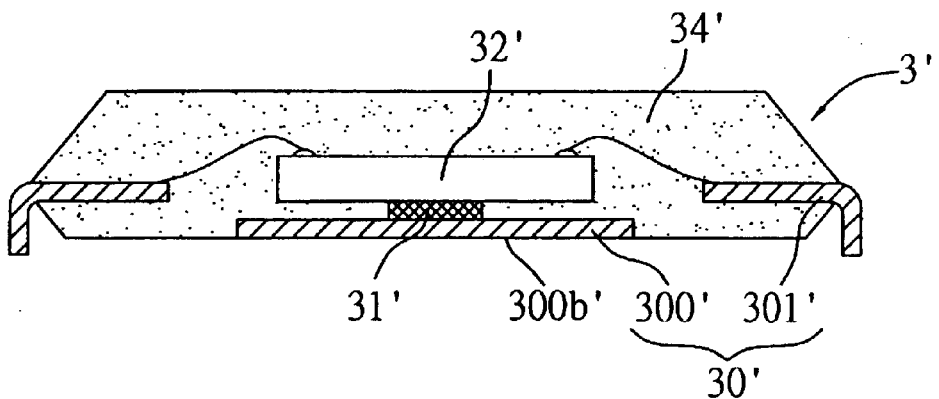
FIG. 6 is a cross-sectional view of another example of the semiconductor package according to the third preferred embodiment of the invention.
Figure 7:
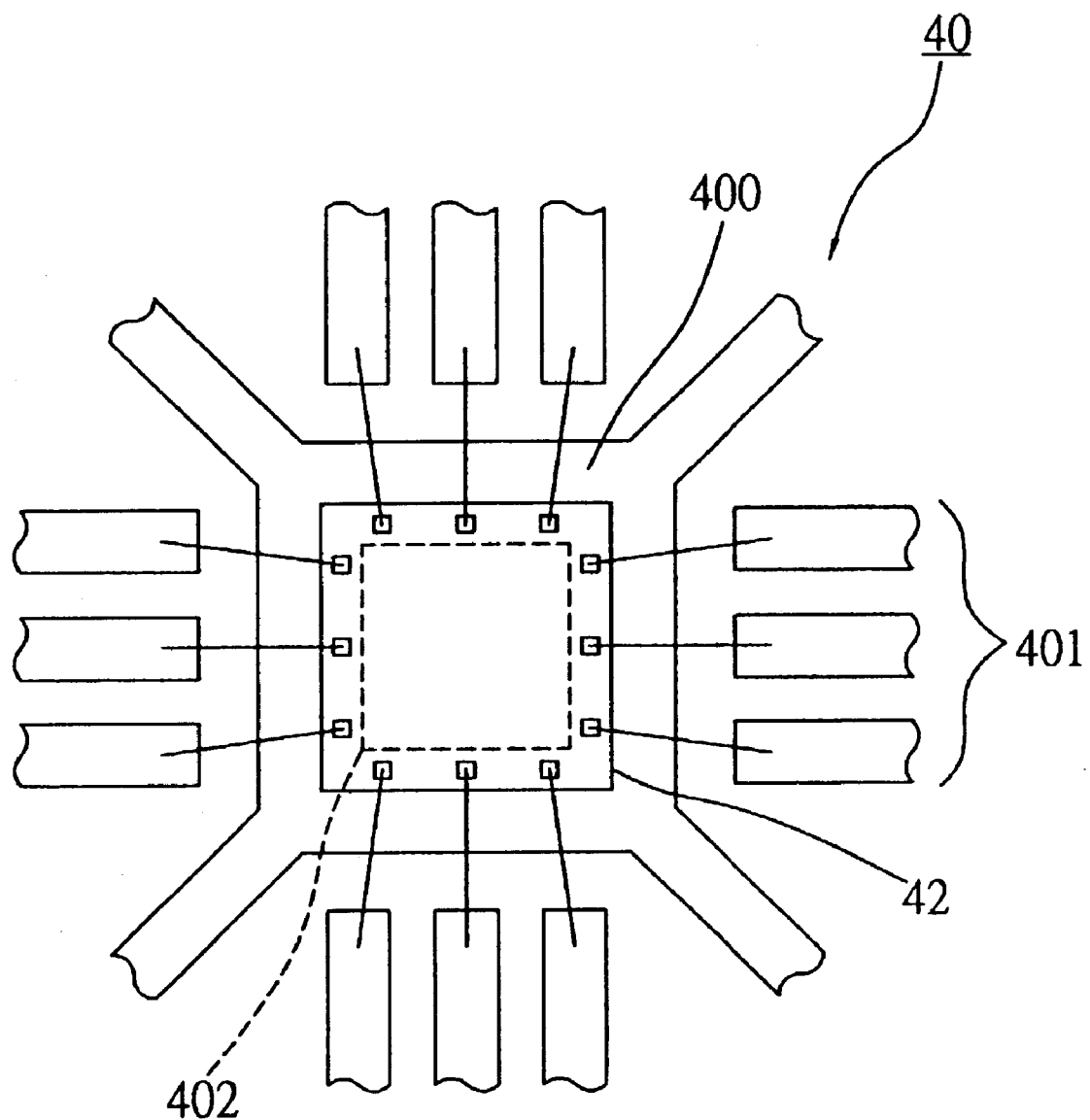
FIG. 7 (PRIOR ART) is a top view of a lead frame having a die pad formed with an opening.
Figure 8A:
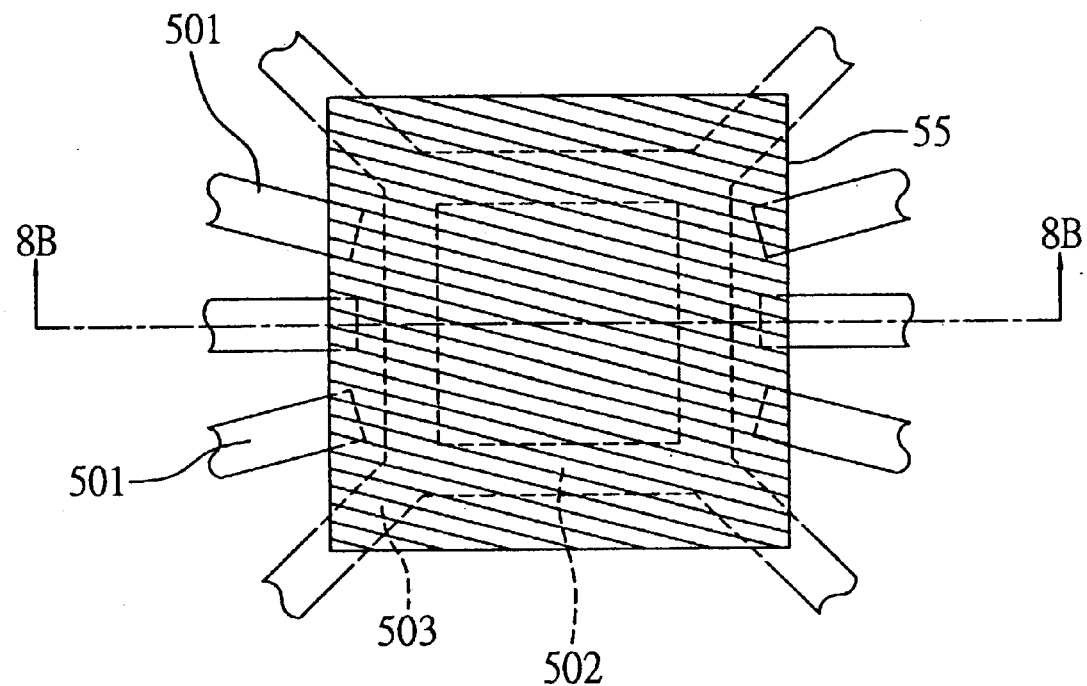
FIG. 8A (PRIOR ART) is a top view of a semiconductor package disclosed in U.S. Pat. No. 5,455,454.
Figure 8B:
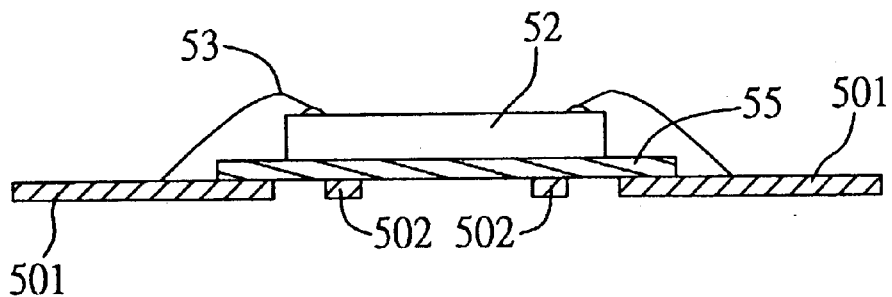
FIG. 8B (PRIOR ART) is a cross-sectional view of the semiconductor package shown in FIG. 8A taken along a line 8B—8B.

FIGS. 5 and 6 illustrate a semiconductor package according to a third preferred embodiment. This semiconductor package 3, 3' is similar in structure to that of the first preferred embodiment, with the difference in that the lead frame 30, 30' is suitably used in a quad flat non-leaded (QFN) package 3 or an exposed pad package 3'. As shown in FIG. 5, the die pad 300 and leads 301 of the lead frame 30 in the QFN package 3 are coplanarly arranged, and a bottom surface 300b of the die pad 300 and bottom surfaces of the leads 301 are exposed to outside of the encapsulant 34. As shown in FIG. 6, for the lead frame 30' in the exposed pad package 3', a bottom surface 300b' of the die pad 300' is also exposed to outside of the encapsulant 34' and helps enhance heat dissipating efficiency for the chip 32'. Moreover, since the chip supporting member 31, 31' can be mounted at any desirable position on the die pad 300, 300', it can be applicable in other types of package structures such as QFP (quad flat package), SOP (small outline package), DIP (dual inline package) and other leadframe-based packages in which the chip supporting member 31, 31' are disposed between the chip 32, 32' and die pad 300. 300' for reducing chip cracks and delamination at attachment interfaces between the chip 32, 32' and die pad 300, 300'.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A semiconductor package with a chip supporting member, comprising:
   a lead frame having at least a die pad and a plurality of leads;
   a chip supporting member having a first surface and a second surface opposed to the first surface, wherein the second surface of the chip supporting member is attached to a central portion of the die pad, and positions on the first surface of the chip supporting member are spaced apart from corresponding positions on the second surface of the chip supporting member by an identical vertical distance, and wherein the chip supporting member is made of a material having a coefficient of thermal expansion similar to that of the chip;
   a chip mounted on the first surface of the chip supporting member and electrically connected to the lead frame; and
   an encupsulant formed on the lead frame for encapsulating the chip supporting member and the chip.

2. The semiconductor package of claim 1, wherein the semiconductor package is a quad flat non-leaded (QFN) package.

3. The semiconductor package of claim 1, wherein the semiconductor package is an exposed pad package.

4. The semiconductor package of claim 1, wherein the die pad is a full pad.

5. The semiconductor package of claim 1, wherein the die pad is a window pad formed with at least an opening.

6. The semiconductor package of claim 1, wherein the chip supporting member is made of a dummy die.

7. The semiconductor package of claim 1, wherein the chip supporting member is a metal plate made of copper or aluminum.

8. The semiconductor package of claim 1, wherein the chip supporting member is made of a polymer material having a coefficient of thermal expansion similar to that of the chip.

9. The semiconductor package of claim 1, wherein the chip supporting member is a cylindrical column.

10. The semiconductor package of claim 1, wherein the chip supporting member is a square column.

11. The semiconductor package of claim 1, wherein the chip supporting member is a trapezoid column.

12. The semiconductor package of claim 1, wherein the chip supporting member is a X-shaped column.

13. The semiconductor package of claim 1, wherein the chip supporting member has a height larger than a minimum distance capable of being penetrated by fillers of a resin used for forming the encapsulant.

14. A semiconductor package with a chip supporting member, comprising:
   a lead frame having at least a die pad and a plurality of leads;
   a chip supporting member having a first surface and a second surface opposed to the first surface, wherein the second surface of the chip supporting member is attached to a central portion of the die pad, and positions on the first surface of the chip supporting member are spaced apart from corresponding positions on the second surface of the chip supporting member by an identical vertical distance, and wherein the chip supporting member is made of a dummy die;
   a chip mounted on the first surface of the chip supporting member and electrically connected to the lead frame; and
   an encupsulant formed on the lead frame for encapsulating the chip supporting member and the chip.

15. The semiconductor package of claim 14, wherein the chip supporting member is a column having a shape selected from the group consisting of cylindrical, square, trapezoid, and X-shape.

16. The semiconductor package of claim 14, wherein the chip supporting member has a height larger than a minimum distance capable of being penetrated by fillers of a resin used for forming the encapsulant.

17. A semiconductor package with a chip supporting member, comprising:
   a lead frame having at least a die pad and a plurality of leads;
   a chip supporting member having a first surface and a second surface opposed to the first surface, wherein the second surface of the chip supporting member is attached to a central portion of the die pad, and positions on the first surface of the chip supporting member arm spaced apart from corresponding positions on the second surface of the chip supporting member by an identical vertical distance, and wherein the chip supporting member is a metal plate;
   a chip mounted on the first surface of the chip supporting member and electrically connected to the lead frame; and
   an encapsulant formed on the lead frame for encapsulating the chip supporting member and the chip.

18. The semiconductor package of claim 17, wherein the metal plate is made of copper or aluminum.

19. The semiconductor package of claim 17, wherein the chip supporting member is a column having a shape selected from the group consisting of cylindrical, square, trapezoid, and X-shape.

20. The semiconductor package of claim 17, wherein the chip supporting member has a height larger than a minimum distance capable of being penetrated by fillers of a resin used for forming the encapsulant.

* * * * *